United States Patent
Nayak et al.

(10) Patent No.: US 7,429,775 B1
(45) Date of Patent: Sep. 30, 2008

(54) METHOD OF FABRICATING STRAIN-SILICON CMOS

(75) Inventors: Deepak Kumar Nayak, Fremont, CA (US); Yuhao Luo, Drive, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/095,814

(22) Filed: Mar. 31, 2005

(51) Int. Cl.
*H01L 29/76* (2006.01)

(52) U.S. Cl. .................. 257/369; 257/288; 257/341; 257/350; 257/351; 257/401

(58) Field of Classification Search .............. 257/369, 257/374, E29.193, 288, 341, 350, 351, 401
See application file for complete search history.

(56) References Cited

U.S. PATENT DOCUMENTS

| | | | |
|---|---|---|---|
| 5,989,986 A | 11/1999 | Hsieh | |
| 6,075,262 A | 6/2000 | Moriuchi et al. | |
| 6,177,319 B1 * | 1/2001 | Chen | 438/275 |
| 6,262,445 B1 | 7/2001 | Swanson et al. | |
| 6,306,712 B1 | 10/2001 | Rodder et al. | |
| 6,399,973 B1 | 6/2002 | Roberds | |
| 6,541,343 B1 | 4/2003 | Murthy et al. | |
| 6,563,152 B2 | 5/2003 | Roberds et al. | |
| 6,573,172 B1 | 6/2003 | En et al. | |
| 6,713,360 B2 | 3/2004 | Jain et al. | |
| 6,743,684 B2 | 6/2004 | Liu | |
| 6,870,179 B2 | 3/2005 | Shaheed et al. | |
| 6,939,814 B2 | 9/2005 | Chan et al. | |
| 7,022,561 B2 | 4/2006 | Huang et al. | |
| 7,052,964 B2 | 5/2006 | Yeo et al. | |
| 7,053,400 B2 | 5/2006 | Sun et al. | |
| 7,132,704 B2 | 11/2006 | Grudowski | |
| 7,193,254 B2 | 3/2007 | Chan et al. | |
| 7,256,084 B2 | 8/2007 | Lim et al. | |
| 7,259,105 B2 | 8/2007 | Kim | |
| 7,314,793 B2 | 1/2008 | Frohberg et al. | |
| 2004/0262694 A1 | 12/2004 | Chidambaram | |
| 2005/0040460 A1 | 2/2005 | Chidambarrao et al. | |
| 2005/0136606 A1 | 6/2005 | Rulke et al. | |
| 2005/0247986 A1 | 11/2005 | Ko et al. | |

(Continued)

OTHER PUBLICATIONS

T. Ghani et al., "A 90nm High Volume Manufacturing Logic Technology Featuring Novel 45nm Gate Length Strained Silicon CMOS Transistors", IEEE, 2003, pp. 1-3, available from tahr.ghani@intel.com, or Intel Corporation (Santa Clara) Corporate Office, 2200 Mission College Blvd., Santa Clara, California 95052-8119.

(Continued)

*Primary Examiner*—Evan Pert
*Assistant Examiner*—Tan N Tran
(74) *Attorney, Agent, or Firm*—Scott Hewett (57) ABSTRACT

Recesses are formed in the drain and source regions of an MOS transistor. The recesses are formed using two anisotropic etch processes and first and second sidewall spacers. The recesses are made up of first and second recesses, and the depths of the first and second recesses are independently controllable. The recesses are filled with a stressed material to induce strain in the channel, thereby improving carrier mobility. The widths and depths of the first and second recesses are selectable to optimize strain in the channel region.

17 Claims, 8 Drawing Sheets

U.S. PATENT DOCUMENTS

| | | | |
|---|---|---|---|
| 2005/0260817 | A1 | 11/2005 | Kim |
| 2006/0009041 | A1 | 1/2006 | Lyer et al. |
| 2006/0014350 | A1 | 1/2006 | Wang et al. |
| 2006/0046366 | A1* | 3/2006 | Orlowski et al. ............ 438/198 |
| 2006/0189167 | A1 | 8/2006 | Wang et al. |
| 2006/0244074 | A1 | 11/2006 | Chen et al. |
| 2007/0001217 | A1 | 1/2007 | Chen et al. |
| 2007/0034963 | A1 | 2/2007 | Sudo |

OTHER PUBLICATIONS

Min Chin Chai, "90 nm Node CMOS Technology Comparison between Intel Corporation and Samsung Electronics", pp. 1-6, May 8, 2003, available from Intel Corporation (Santa Clara) Corporated Office, 2200 Mission College Blvd., Santa Clara, California 95052-8119.

A. Brand et al., "Intel's 0.25 Micron, 2.0Volts Logic Process Technology", pp. 1-9, available from Intel Corporation (Santa Clara) Corporate Office, 2200 Mission College Blvd., Santa Clara, California 95052-8119.

B. P. R. Chidambaram et al., "35% Drive Current Improvement from Recessed-SiGe Drain Extensions on 37 nm Gate Length PMOS", 2004 Sumposium on VLSI Technology, Digest of Technical Papers, pp. 48-49, available from Texas Instruments, MS 3739, 13560 N. Central Expressway, Dallas, TX 75243.

U.S. Appl. No. 11/146,640, Luo, Y, et al., "Strain-Silicon CMOS using Etch-Stop Layer and Method of Manufacture", filed Jun. 7, 2005, 17 pages, available from Xilinx Inc., 2100 Logic Drive, San Jose, CA 95124.

U.S. Appl. No. 11/224,566, Luo, Y. et al., "Semiconductor Device with Backfilled Isolation", filed Oct. 6, 2005, 13 pages: available from Xilinx Inc., 210 Logic Drive, San Jose, CA 95124.

U.S. Appl. No. 11/221,207, Nayak D.K. et al., "CMOS Device With Stressed Sidewall Spacers", filed Sep. 8, 2005, 13 pages, available from Xilinx Inc., 2100 Logic Drive, San Jose, CA 95124.

Pidin, S, et al., "A Novel Strain Enhanced CMOS Architecture Using Selectivity Deposited High Tensile and High Compressive Silicon Nitride Films", IEEE 2004, pp. 1-8, available from IEEE, 3 Park Avenue, 17 th Floor, New York, NY 10016-5997.

Thompson, S. et al., "A 90 nm Logic Technology Featuring 50 nm Strained Silicon Channel Transistors, 7 Layers of Cu Interconnects Low K ILD, and um2 SRAM Cell", iedm 2002, pp. 1-32, available from Intel Corporation, www.intel com/research/silicon.

Luo, Y. et al., "Enhancement of CMOS Performance by Process-Induced Stress", IEEE Transactions on Semiconductors Manufacturing, vol. 18, No. 1, Feb. 2005. pp. 63-68.

* cited by examiner

METHOD OF FABRICATING STRAIN-SILICON CMOS

FIELD OF THE INVENTION

The present invention relates generally to semiconductor devices, and more particularly to semiconductor devices having improved mobility due to channel strain.

BACKGROUND OF THE INVENTION

Programmable logic devices (PLDs) are a well-known type of integrated circuit that can be programmed to perform specified logic functions. One type of PLD, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), transceivers, and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an internal memory or an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output (I/O) resources by an interconnect switch matrix. Each function block of the CPLD includes a two-level AND/OR structure similar to those used in Programmable Logic Arrays (PLAs) and Programmable Array Logic (PAL) devices. In some CPLDs, configuration data is stored on-chip in non-volatile memory. In other CPLDs, configuration data is stored on-chip in non-volatile memory, then downloaded to volatile memory as part of an initial configuration sequence.

For all of these programmable logic devices (PLDs), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable.

ICs use various sorts of devices to create logic circuits. Many types of ICs use complementary metal-oxide-semiconductor ("CMOS") logic circuits. CMOS logic circuits use CMOS cells that have a first-conductivity-type metal-oxide-semiconductor ("MOS") transistor (e.g., a p-type MOS ("PMOS") transistor) paired with a second-conductivity-type MOS transistor (e.g., an n-type MOS ("NMOS") transistor). CMOS cells can hold a logic state while drawing only very small amounts of current.

It is generally desirable that MOS transistors, whether used in a CMOS cell or used individually, provide good conductivity between the source and the drain of the MOS transistor when operating voltage is applied to the gate of the MOS transistor. In other words, it is desirable that current flows through the channel between the source and the drain when the MOS transistor is turned on.

The amount of current flowing through the channel of an MOS transistor is proportional to the mobility of charge carriers in the channel. Increasing the mobility of the charge carriers increases the amount of current that flows at a given gate voltage. Higher current flow through the channel allows the MOS transistor to operate faster. One of the ways to increase carrier mobility in the channel of a MOS transistor is to produce strain in the channel.

There are several ways to create strain in the channel region. One approach is to deposit stressed layers over a MOS transistor. Another approach is to modify existing structures, such as by implanting ions into the drain and source regions. Yet another approach is to grow stressed material in a recess of the source and/or drain region of a MOS transistor.

Figure 1:
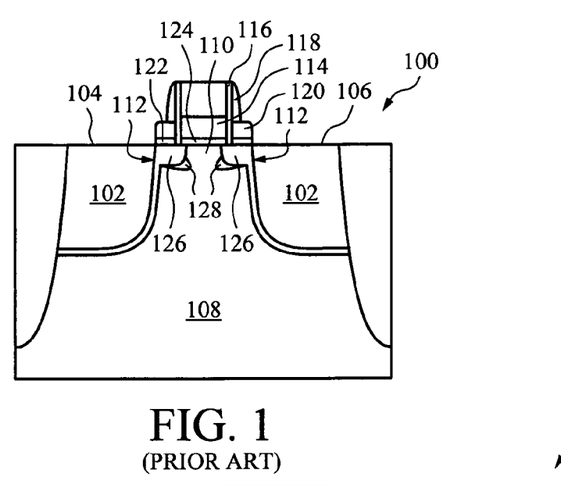
FIG. 1 is a simplified cross section of a prior art MOS transistor having stressed material in the source and drain regions.

FIG. 1 is a simplified cross section of a prior art MOS transistor 100 having stressed material 102 in the source 104 and drain 106 regions. The MOS transistor 100 is a PMOS transistor formed on a silicon substrate 108, and the stressed material is silicon-germanium ("SiGe") that has been grown in recesses that were previously etched in the silicon. The SiGe has a compressive stress that strains the channel region 110. However, the edges 112 of the SiGe regions are relatively far from the channel region 110, reducing their effectiveness at producing the desired strain in the channel region. The edge 112 can be pushed towards channel by forming undercut during etch, but it is hard to control and difficult to monitor the final amount of undercutting.

Other elements of the PMOS transistor 100 include a gate 114, gate spacers 116, 118, 120, 122, gate dielectric 124, source/drain extension regions 126, and halo implant regions 128.

Another prior art PMOS device uses thin gate offset spacers to define the edges of recesses etched in the source/drain regions. The recesses are then filled with SiGe. In this case, the depth of source/drain area recess is limited by the width of offset spacer due to short channel effect.

Therefore, techniques for producing strain in a channel region of a MOS transistor that avoid the disadvantages of the prior art are desired. Greater control over the amount of strain produced in the channel region is further desirable.

SUMMARY OF THE INVENTION

Recesses are formed in the drain and source regions of an MOS transistor. The recesses are formed using two anisotropic etch processes and first and second sidewall spacers. The recesses are made up of first and second recesses, and the depths of the first and second recesses are independently controllable. The recesses are filled with a stressed material to induce strain in the channel, thereby improving carrier mobility. The widths and depths of the first and second recesses are selectable to optimize strain in the channel region.

DETAILED DESCRIPTION OF THE DRAWINGS

Figure 2:
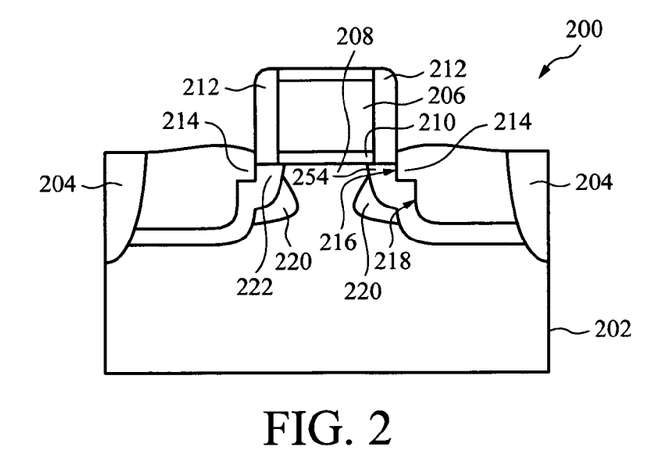
FIG. 2 is a simplified cross section of an MOS transistor according to an embodiment of the invention.

FIG. 2 is a simplified cross section of an MOS transistor 200 according to an embodiment of the invention. The MOS transistor 200 is fabricated on a substrate 202, such as a silicon wafer or silicon-on-insulator (SOI) wafers. In an IC, many transistors are fabricated on a piece of the substrate, commonly called a die or chip. Transistors on a chip are often separated by trench isolation dielectric 204 or other isolation structure.

A gate 206 is isolated from a channel region 208 by a gate dielectric layer 210. Sidewall spacers 212 align regions of stressed material 214 to the channel region 208. The stressed material 214 has a first edge 216 close to the channel region 208 and next to a source/drain extension region 254, and a second edge 218 that is further away from the channel region and extends deeper into the substrate 202, both edges along one end of the stressed material. The regions of stressed material 214 induce strain in the channel region 208 to improve carrier mobility. For example, the stressed material may be SiGe epitaxially grown in etched recesses to produce compressive strain, or SiC or carbon-doped silicon epitaxially grown in etched recesses to produce tensile strain. Halo regions 220 and lightly doped drain ("LDD") regions 222 (commonly referred to as source/drain ("S/D") extensions, or simply drain extensions ("DEs")) are discussed below in reference to FIGS. 3A-3J.

FIGS. 3A-3J are a series of cross sectional views illustrating steps of forming a MOS transistor according to an embodiment of the invention. For purposes of convenient discussion, the MOS transistor is a PMOS transistor in a CMOS cell. Those of skill in the art with appreciate that NMOS transistors according to embodiments of the invention may be similarly obtained with suitable substitution of materials, and that embodiments of the invention do not have to be part of a CMOS cell.

Figure 3A:
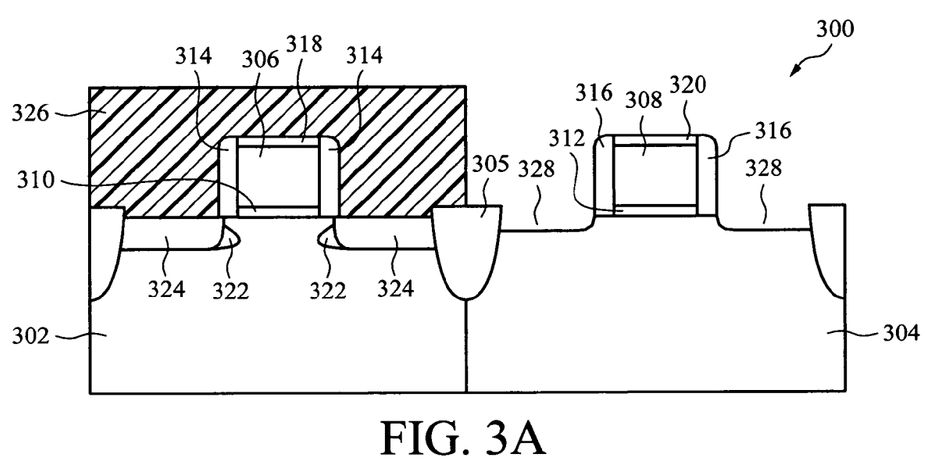
FIGS. 3A-3J are a series of cross sectional views illustrating steps of forming an MOS transistor according to an embodiment of the invention.

FIG. 3A is a cross section of a partially fabricated CMOS cell 300 that has a first-conductivity-type (e.g., NMOS) portion 302, which will become an NMOS transistor separated from a second-conductivity-type (e.g., PMOS) portion 304, which will become a PMOS transistor, by an isolation region 305, such as shallow trench isolation ("STI") or field oxide (e.g., "LOCOS") (see also, FIG. 2, ref. num. 204). FIG. 3A shows the fabrication sequence after gates 306, 308 have been formed over respective gate dielectrics 310, 312, and first gate sidewall offset spacers 314, 316 have been formed. In a particular embodiment the gates are made of polysilicon and the first gate sidewall offset spacers are made of silicon oxide and have a thickness of about 5 nm to about 30 nm. Cap layers 318, 320, which are silicon nitride layers in a particular embodiment, serve as etch-stop layers in subsequent processing to protect the gate, and are eventually stripped.

The NMOS portion 302 has been processed through a halo implant and a lightly-doped drain ("LDD") implant(s) to form halo regions 322 and LDD regions 324. Halo and LDD techniques are well-known in the art and a detailed description is thus omitted.

The N-well mask (not shown) is used to pattern photoresist 326 over the NMOS portion 302. The photoresist 326 protects the NMOS portion during a selective anisotropic silicon etch step that forms first recesses 328 in source and drain regions that are about 5 nm deep (i.e., the bottom of the recess is about 5 nm from the original surface of the silicon) to about 50 nm deep in particular embodiments.

Figure 3B:
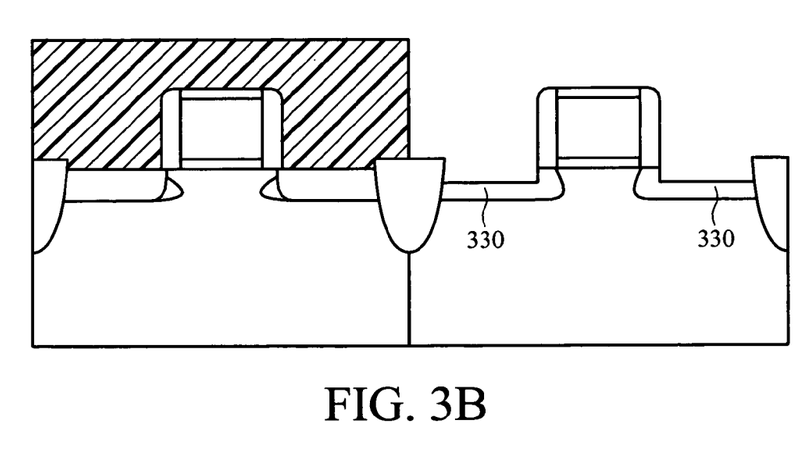
Figure 3C:
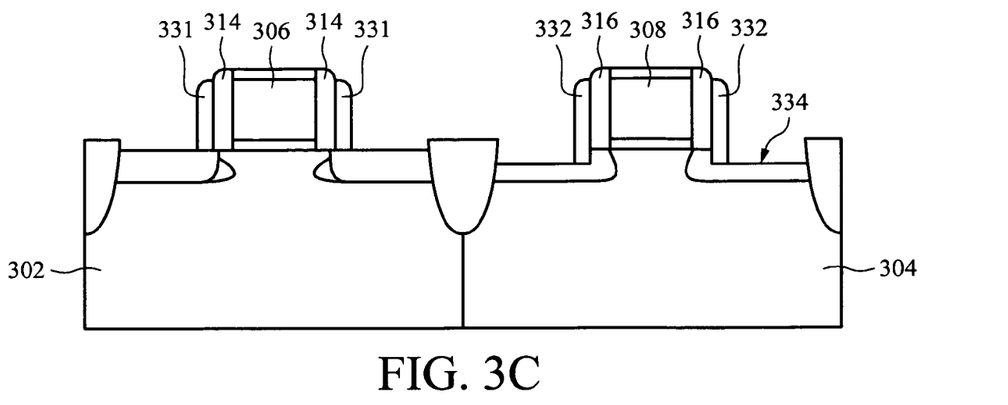
Figure 3D:
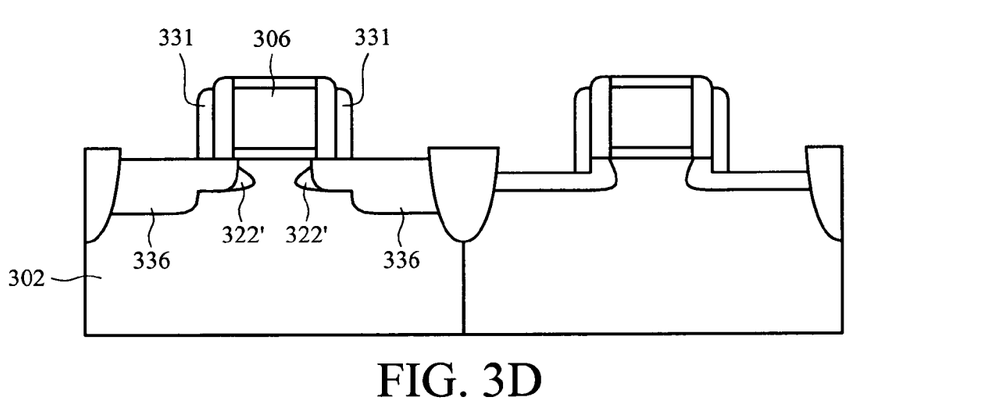

FIG. 3B shows the partially fabricated CMOS cell after a PMOS halo implant, which forms PMOS halo regions 330. The photoresist 326 is then stripped and a layer of SiN (not shown) is deposited over the CMOS cell. FIG. 3C shows the CMOS cell after the SiN layer has been anisotropically etched to form second sidewall spacers 331 on the first sidewall spacers 314 on the gate 306 of the NMOS portion 302, and to form second sidewall spacers 332 on the first sidewall spacers 316 of the gate 308 of the PMOS portion 304 of the CMOS cell. In a particular embodiment, the second sidewall spacers 332 are silicon nitride ("SiN") formed by depositing a SiN film over the substrate and then performing an anisotropic etch. The second sidewall spacers 332 extend to a surface 334 of the first recess in the PMOS portion 304. FIG. 3D shows the partially fabricated CMOS cell after performing the source/drain implant on the NMOS portion 302 after rapid thermal pulse ("RTP") annealing for dopant activation and NMOS LDD drive-in to form NMOS halo regions 322' and source/drain regions 336. The second sidewall spacers 331 self-align the implant to the gate 306 of the NMOS portion 302.

Figure 3E:
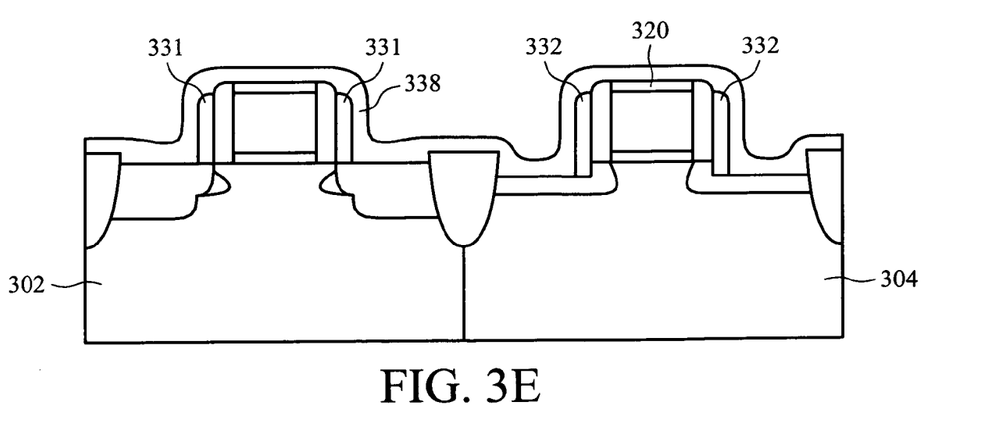

FIG. 3E shows the partially fabricated CMOS cell with an epi-mask film 338 deposited over the CMOS cell. The epi-mask film 338 will be removed from the PMOS portion 304 of the CMOS cell, and is sufficiently thick to protect the NMOS portion 302 of the CMOS cell during a later epitaxial growth step, which occurs at conditions incompatible with photoresist. In a particular embodiment, the epi-mask film 338 is a silicon oxide film about 20 nm to about 100 nm thick. The epi-mask film is selectively etchable from the cap layer 320 and the second sidewall spacers 331, 332. In other words, an etch system exists that preferentially etches the epi-mask film without appreciably etching the sidewall spacers. Other materials are used for mask, spacer, and cap layers in alternative embodiments of MOS transistors. The choice of materials and process methods can depend on many factors, such as the critical dimension of the fabrication process, and the thicknesses of the various layers. The SiN-silicon oxide system is just one of many examples. Other films like metal-oxide, metal-nitride, metal-oxide, doped oxide are also applicable.

Figure 3F:
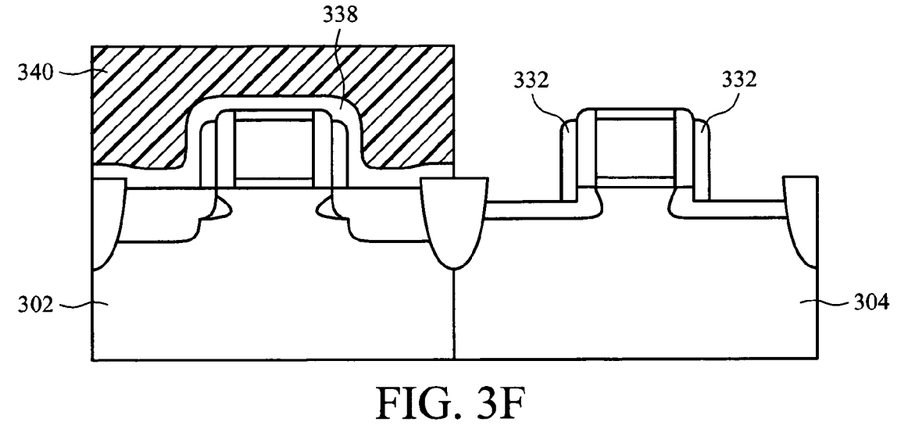

FIG. 3F shows the partially fabricated CMOS cell with a layer of photoresist 340 patterned to protect the epi-mask film 338 over the NMOS portion 302 during an etch step. The etch step has removed the epi-mask film from the PMOS portion 304 of the CMOS cell, without removing the second sidewall spacers 332. In a particular embodiment, the second sidewall spacers 332 are substantially the same thickness as they were before the etch step. Alternatively, the etch step removes a selected amount of material from the second sidewall spacers 332 to provide thinned second sidewall spacers.

Figure 3G:
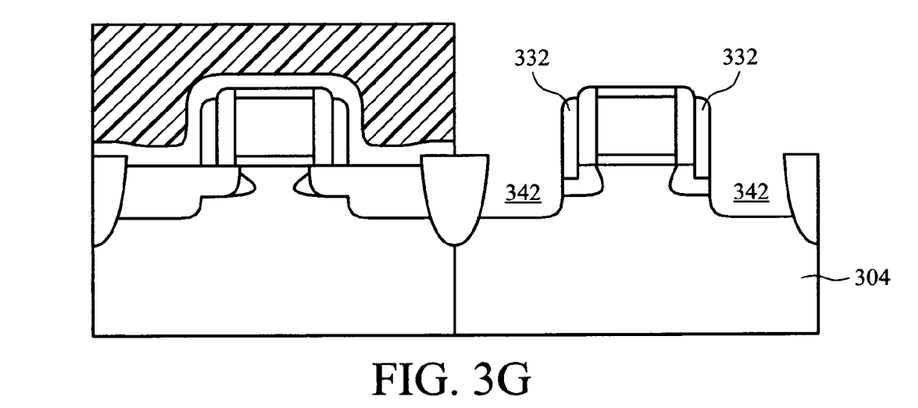

FIG. 3G shows the CMOS cell with second recesses 342 formed in the source and drain regions of the PMOS portion 304. The second recesses are formed by an anisotropic silicon etch step. Alternatively, second recesses are formed by an isotropic silicon etch step that undercuts the second sidewall spacers a desired distance, or by a combination of an isotropic etch step and an anisotropic etch step. In a particular embodiment, the second recesses have a depth between about 20 nm and about 200 nm from the original surface of the silicon wafer. In this embodiment, the first recess is a shallow recess and the second recess is a deeper recess.

Figure 3H:
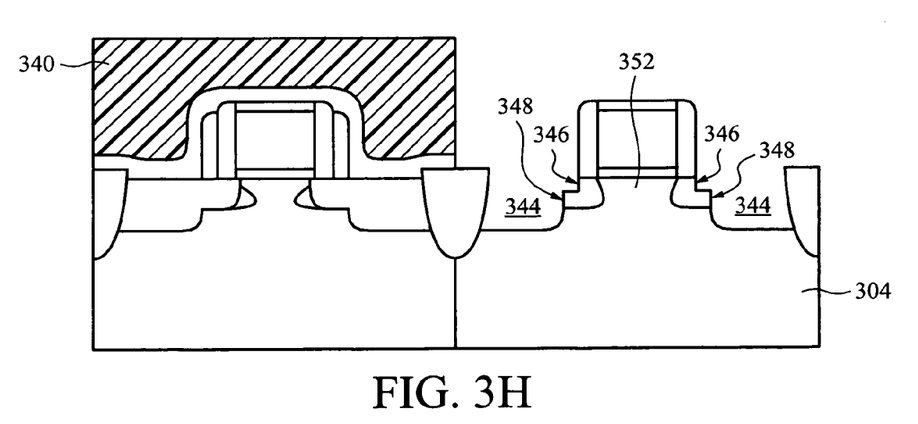

FIG. 3H shows the CMOS cell after the second sidewall spacers (see FIG. 3G, ref. num. 332) have been removed (i.e., etched away). The patterned photoresist 340 remains over the NMOS portion 302, but is optional in embodiments in which the patterned epi-ask layer 338 provides masking during the silicon etch step(s) that form the second recess, and the second sidewall spacer removal step. Recesses 344 are formed from the first recesses (see FIG. 3A, ref. num. 328) and the second recesses (see FIG. 3G, ref. num. 342). The recess 344 has a first recess sidewall 346 and a second recess sidewall 348. The first recess sidewall 346 is closer to the center of a channel region 352 than is the second recess sidewall 348.

Figure 3I:
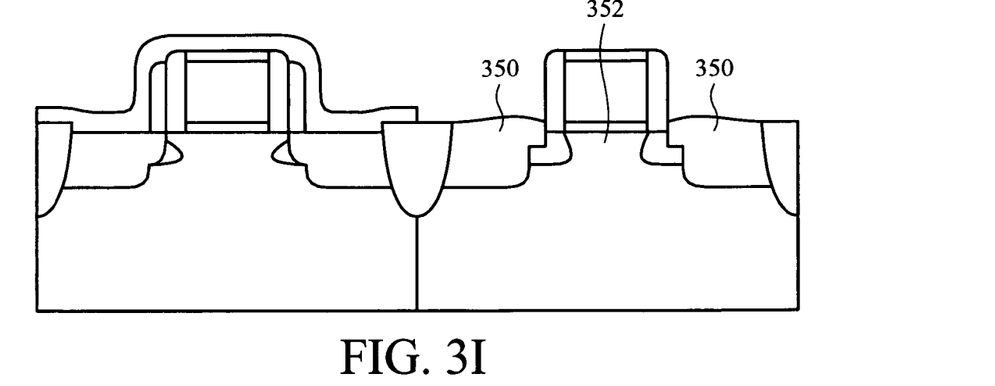

FIG. 3I shows the recesses (see FIG. 3H, ref. num. 344) filled with stressed material 350. The stressed material 350 has residual stress that induces strain in the channel region 352, which in turn increases carrier mobility and improves the operating speed of the MOS transistor.

In a particular embodiment, the stressed material 350 is boron-doped SiGe that is epitaxially grown in the recesses on the underlying silicon by a selective epitaxial growth ("SEG") process to fill in the recesses, or alternatively to overfill the recesses (i.e., to a height higher than the original surface of the silicon wafer). Stressed material that is doped can provide doping species for the underlying and adjacent silicon. In other words, the boron-doped SiGe acts as a p-type dopant source. Other stressed materials and dopants are used in alternative embodiments, such as SiC, GaAs, GaN, which are semiconductors having different lattice constants than Si and that can induce strain into channel.

Figure 3J:
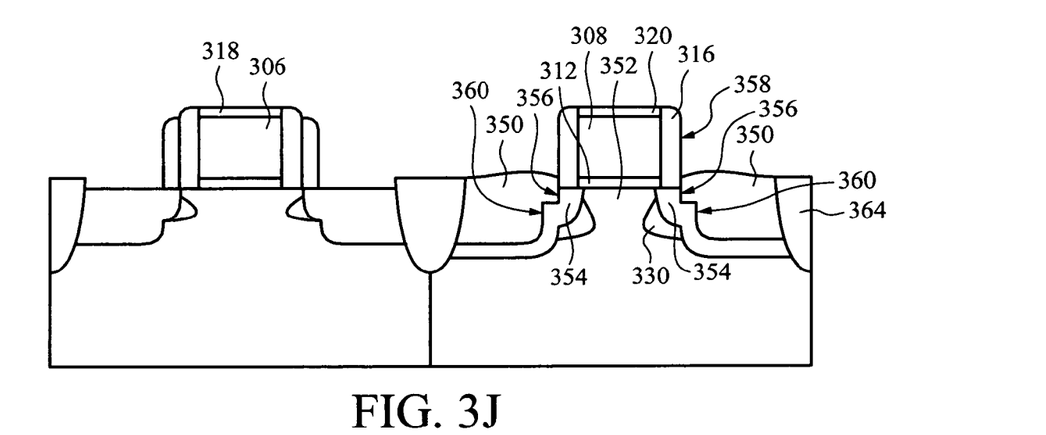

FIG. 3J shows the CMOS cell after a RTP annealing step, which has driven boron into the silicon to form extension regions 354 and has activated the boron dopant. The CMOS cell is completed using conventional processing steps, such as stripping the cap layers 318, 320, forming silicide over the gates 306, 308, and so forth.

The PMOS portion 304 has stressed material 350 on either side of the channel region 352. The stressed material 350 extends to a first edge 356 that is next to the extension region 354 and essentially even with the surface 358 of the first sidewall spacer 316. Alternatively, the first edge extends further toward the channel region 352 than the surface 358 of the first sidewall spacer 316.

The stressed material 350 extends to a second edge 360 that is also next to the extension region 354, essentially across from the PMOS halo region 330 (see also, FIGS. 3B, 3C and associated text). The amount of strain in the drain region depends upon several factors, which include: the amount of silicon between the stressed material, the depth of the first edge (relative to the gate oxide 312), the depth of the second edge 360 (which extends deeper into the silicon than the first edge, relative to the gate oxide), and the lengths (i.e., amount) of the stressed material in the upper region of the stressed material (defined by the first edge 356 and isolation structure 364) and lower region of the stressed material (defined by the second edge 360 and the isolation structure 364).

The length of silicon between the first edges 356 is shorter than the length between the second edges 360. Thus, for a given stress, the strain in the portion of the channel region between the first edges 356 is greater than the strain in the portion of the channel region between the second edges 358. The total stress is controllable by selecting the depth of the second recess (see FIG. 3H, ref. num. 344). Increasing the depth of the second recess increases the total stress in the stressed material 350. Since the first edges 356 bring the stressed material very close to the channel area, and the depth of the second recess can be selected to produce high stress, very high strain can be induced in the channel region of the device. The depths of the first and second recesses are separately controllable to optimize the stress contributed by the respective portions of the stressed material. Conventional methods using isotropic etch techniques to form deep undercuts are hard to control and have poor uniformity. Also it is difficult to do inline size monitoring of the undercut.

Figure 4:
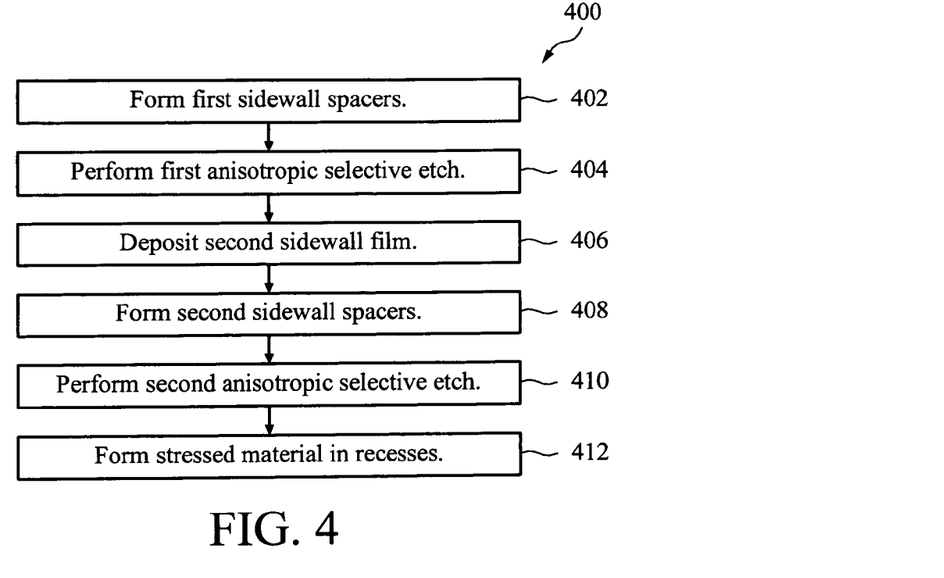
FIG. 4 is a flow chart of a method of fabricating an MOS transistor according to an embodiment of the invention.

FIG. 4 is a flow chart of a method of fabricating an MOS transistor 400 according to an embodiment of the invention. The terms "PMOS transistor" and "NMOS transistor" are used for simplicity of illustration to describe a device during any portion of its fabrication sequence, as well as the finished transistors. Many common steps familiar to those of skill in the art of MOS transistor fabrication are omitted for clarity of discussion. First sidewall spacers are formed on the sides of a gate (step 402). In a particular embodiment, the first sidewall spacers are oxide spacers having a thickness between about 5 nm and about 30 nm. A first anisotropic silicon etch is performed in the source and drain regions of the MOS transistor (step 404) to form a first recess. The first anisotropic silicon etch is self-aligned to the first sidewall spacers. In a particular embodiment, the first recess is etched to a depth of between about 5 nm and about 50 nm. An isotropic etch is optionally performed if undercutting of the first sidewall spacers is desired. A halo implant, extension implant, and/or LDD implant are typically performed. The halo implantation step can be performed before or after the first silicon anisotropic etch step. The halo implant is more localized than in a conventional device, whether it is performed before or after formation of the first recess, as long as halo thermal activation is after the formation of the first recess. This localized halo improves short channel effect and thus device performance.

A second sidewall film is deposited on the MOS transistor (step 406) and is etched to form second sidewall spacers (step 408). In a particular embodiment, the second sidewall film is a SiN film having a thickness between about 5 nm and about 200 nm, and the second sidewall spacers extend to the surface of the first recess. A second anisotropic silicon etch is performed in the source and drain regions of the MOS transistor (step 410), and the second sidewall spacers are removed (step 412) to form a second recess. The second anisotropic silicon etch is self-aligned to the second sidewall spacers. In a particular embodiment, the second recess is etched to a depth of between about 50 nm and about 200 nm from the floor of the first recess. The first and second recesses form a combined recess having a depth between about 70 nm and about 200 nm. An isotropic etch is optionally performed if undercutting is desired.

Stressed material is formed in the combined recess (step 414). The stressed material optionally acts as a dopant source for the underlying silicon. In a particular embodiment, the MOS transistor is a PMOS transistor and boron-doped SiGe is epitaxially grown in the combined recess using an in-situ doping technique to create compressively stressed material that induces compressive strain in a channel region of the PMOS transistor. In an alternative embodiment, the MOS transistor is an NMOS transistor and SiC is grown in the combined recess.

If the stressed material is doped, a thermal treatment, such as an RTP, is typically performed to drive the dopant into the silicon and to activate the dopant. Conventional processing steps are performed to complete the fabrication of the MOS transistor. Using a two-step etch to form a combined recess in combination with using doped stress material provides independent control of depth and profile of drain/source extensions and the source and drain. Similarly, using doped stressed material in a combined recess provides an ultra-shallow drain/source extension (compared to a conventionally implanted drain/source extension. Additionally, using stressed material, such as boron-doped SiGe, in a combined recess provides high stress in the channel and lower series resistance.

Figure 5:
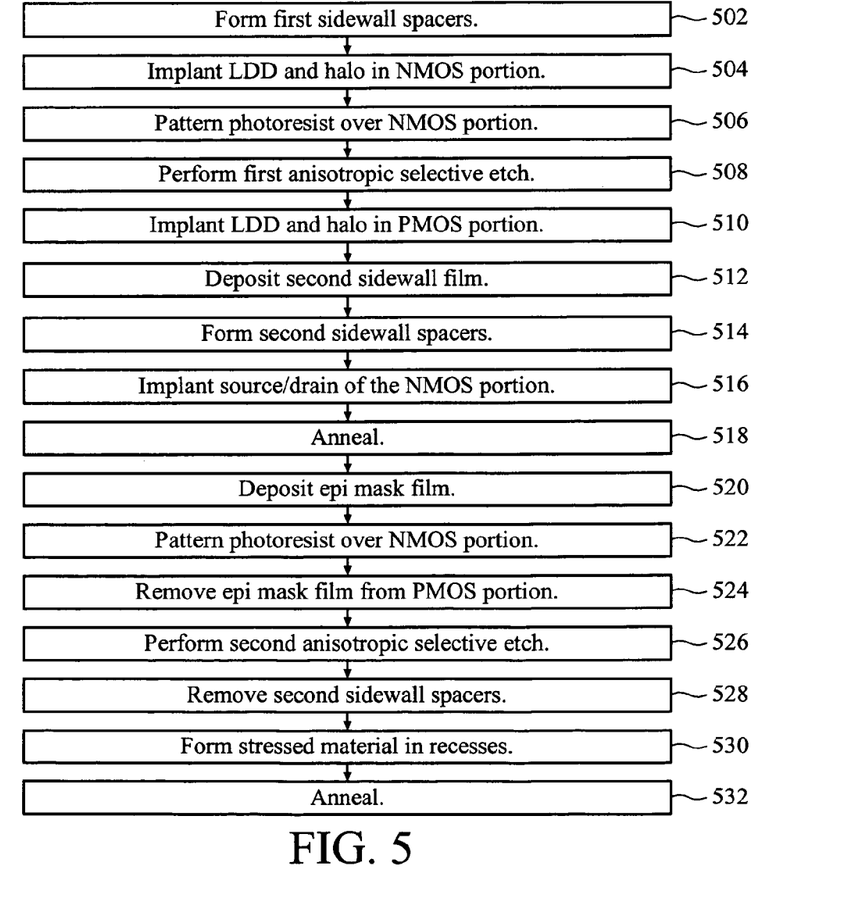
FIG. 5 is a flow chart of a method of fabricating an MOS transistor in a CMOS cell according to an embodiment of the invention.

FIG. 5 is a flow chart of a method of fabricating an MOS transistor in a CMOS cell 500 according to an embodiment of the invention. Many common steps familiar to those of skill in the art of MOS transistor fabrication are omitted for clarity of discussion. An example wherein recesses are formed in the PMOS transistor of the CMOS cell and then filled with compressive material will be described. Alternatively, recesses are formed in the NMOS transistor of the CMOS cell and then filled with tensile material. In yet another embodiment, recesses are formed in both the PMOS and NMOS transistors in a CMOS cell, and the recesses are filled with compressive material and tensile material, respectively.

First sidewall spacers are formed on the sides of the gates of the PMOS and NMOS transistors (step 502). In a particular embodiment, the first sidewall spacers are oxide spacers having a thickness between about 5 nm and about 30 nm. LDD and halo implants are performed on the NMOS transistor (step 504) and photoresist is patterned over the NMOS transistor (step 506). A first anisotropic selective etch (e.g., an etch that selectively etches silicon in a particular direction) is performed to etch away silicon in the exposed source/drain areas of the PMOS transistor to form first recesses having a depth of between about 20 nm and about 50 nm (step 508). A halo implant, extension implant, and/or LDD implant are performed on the PMOS transistor (step 510). The halo implantation step can be performed before or after the first silicon anisotropic etch step. The patterned photoresist is optionally removed from the NMOS portion of the CMOS cell at this point.

A second sidewall film is deposited on the CMOS cell (step 512) and an anisotropic etch is performed to form second sidewall spacers on at least the PMOS transistor (step 514), and typically on both the PMOS transistor and the NMOS transistor. A source/drain implant is performed on the NMOS transistor (step 516), followed by RTP annealing (step 518) for dopant activation and NMOS LDD drive in.

An epi-mask film is deposited over the CMOS cell (step 520), and photoresist is patterned so as to protect the NMOS portion of the CMOS cell (step 522). The epi-mask film is removed from the PMOS portion (step 524). A second selective anisotropic etch is performed in the source and drain regions of the PMOS transistor (step 526) and the second sidewall spacers are removed (step 528) to form second recesses. The first and second recesses form combined recesses.

Stressed material, such as SEG boron-doped SiGe, is formed in the combined recesses (step 530). In a particular embodiment, an SEG technique is used. A thermal treatment, such as an RTP anneal, is performed (step 532) for boron activation and extension drive in into the semiconductor material (e.g., silicon) proximate to the stressed material. Conventional processing steps are performed to complete the fabrication of the CMOS cell.

FIGS. 6A-6G are a series of cross sectional views illustrating steps of forming an MOS transistor according to another embodiment of the invention. For purposes of convenient discussion, the MOS transistor is a PMOS transistor in a CMOS cell. Those of skill in the art with appreciate that NMOS transistors according to embodiments of the invention may be similarly obtained with suitable substitution of materials, and that embodiments of the invention do not have to be part of a CMOS cell.

Figure 6A:
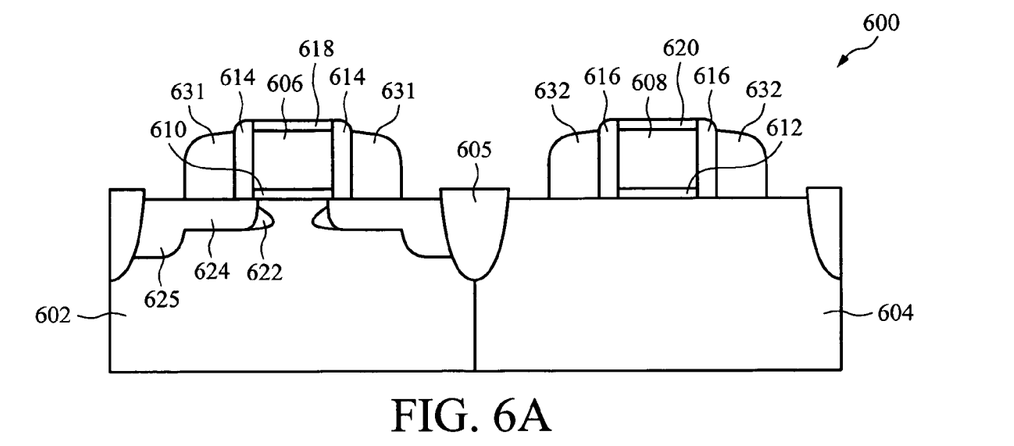
FIGS. 6A-6G are a series of cross sectional view illustrating steps of forming an MOS transistor according to another embodiment of the invention.

FIG. 6A is a cross section of a partially fabricated CMOS cell 600 that has a first-conductivity-type (e.g., NMOS) portion 602, which will become an NMOS transistor separated from a second-conductivity-type (e.g., PMOS) portion 604, which will become a PMOS transistor, by an isolation region 605, such as shallow trench isolation ("STI") or field oxide (e.g., "LOCOS") (see also, FIG. 2, ref. num. 204). FIG. 6A shows the fabrication sequence after gates 606, 608 have been formed over respective gate dielectrics 610, 612, first gate sidewall offset spacers 614, 616, and second gate sidewall offset spacers 631, 632 have been formed. In a particular embodiment the gates are made of polysilicon and the first gate sidewall offset spacers are made of silicon oxide and have a thickness of about 5 nm to about 30 nm. Cap layers 618, 620, which are silicon nitride layers in a particular embodiment, serve as etch-stop layers in subsequent processing to protect the gate, and are eventually stripped.

The NMOS portion 602 has been processed through a halo implant and a lightly-doped drain ("LDD") implant(s) to form halo regions 622, LDD regions 624, and source/drain regions 625. Halo and LDD techniques are well-known in the art and a detailed description is thus omitted.

Figure 6B:
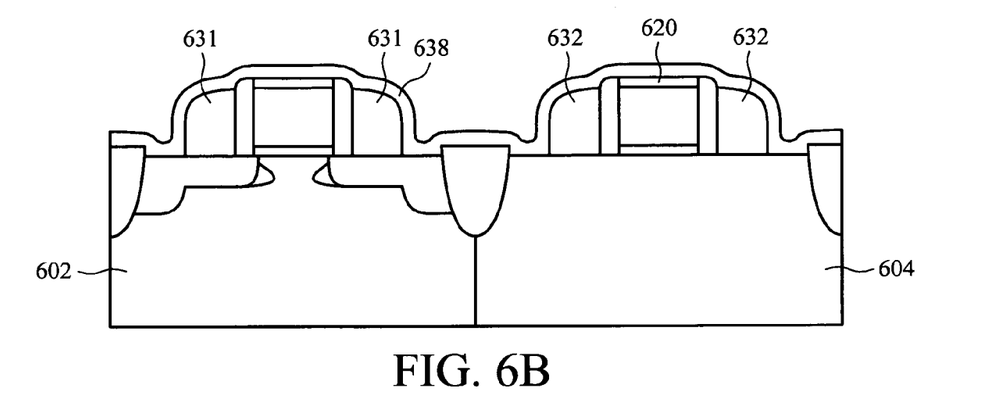

FIG. 6B shows the partially fabricated CMOS cell with an epi-mask film 638 deposited over the CMOS cell. The epi-mask film 638 will be removed from the PMOS portion 604 of the CMOS cell, and is sufficiently thick to protect the NMOS portion 602 of the CMOS cell during a later epitaxial growth step, which occurs at conditions incompatible with photoresist. In a particular embodiment, the epitaxial mask film 638 is a silicon oxide film about 20 nm to about 100 nm thick. The epitaxial mask film is selectively etchable from the cap layer 620 and the second sidewall spacers 631, 632. In other words, an etch system exists that preferentially etches the epitaxial mask film without appreciably etching the sidewall spacers. Other materials are used for mask, spacer, and cap layers in alternative embodiments of MOS transistors. The choice of materials and process methods can depend on many factors, such as the critical dimension of the fabrication process, and the thicknesses of the various layers. The SiN-silicon oxide system is just one of many examples. Other films like metal-oxide, metal-nitride, metal-oxide, doped oxide are also applicable.

Figure 6C:
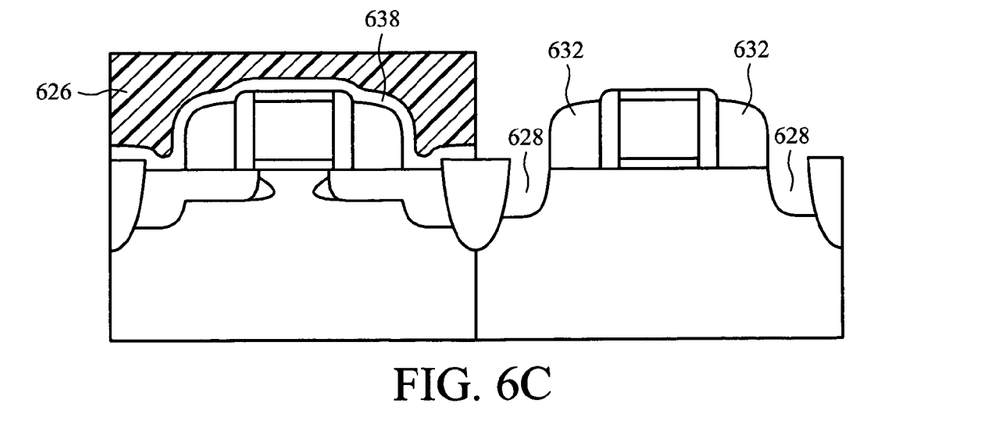

FIG. 6C shows the CMOS cell after a layer of photoresist 626 has been patterned using the N-well mask and the epitaxial mask film 638 has been removed from the PMOS portion 604. A selective anisotropic etch removes exposed silicon in the PMOS portion 604 to form first recesses 628, which are self-aligned to the second sidewall spacers 632. In a particular embodiment, the first recesses will be the deeper recesses and have an initial depth between about 20 nm and about 200 nm from the original surface of the silicon wafer.

Figure 6D:
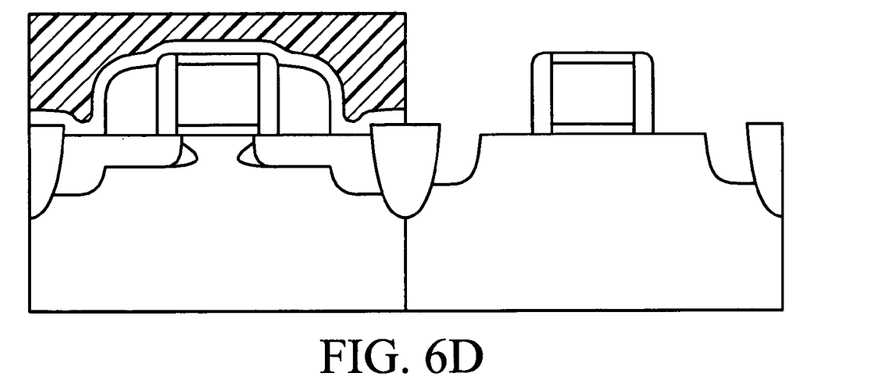
Figure 6E:
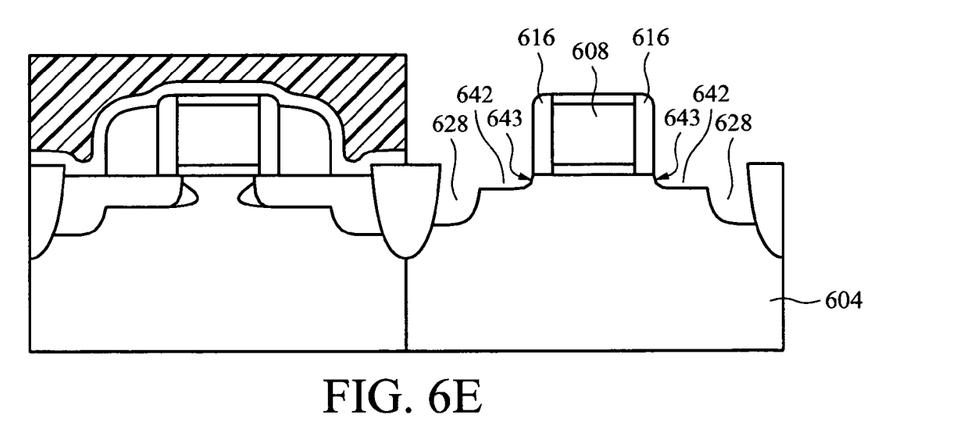

FIG. 6D shows the CMOS cell after the second sidewall spacers have been removed. FIG. 6E shows the CMOS cell after a second silicon-selective anisotropic etch is performed to form second recesses 642 formed in the source and drain regions of the PMOS portion 604. In this embodiment, the second recesses are shallow recesses and the first recesses are deep recesses (compare FIGS. 3A and 3H, ref. nums. 328, 242, wherein the first recesses are shallow recesses and the second recesses are deep recesses). The second anisotropic silicon etch also removes exposed silicon in the first recesses 628. An isotropic etch step is optionally performed to bring the center edges 643 of the second recesses 642 underneath the first gate sidewall offset spacers 616, or underneath the gate 608 (not shown). In particular embodiments, the second recesses have a depth between about 5 nm deep (i.e., the bottom of the recess is about 5 nm from the original surface of the silicon) to about 50 nm deep. A halo implant for the PMOS region is optionally performed before or after forming the second recesses.

Figure 6F:
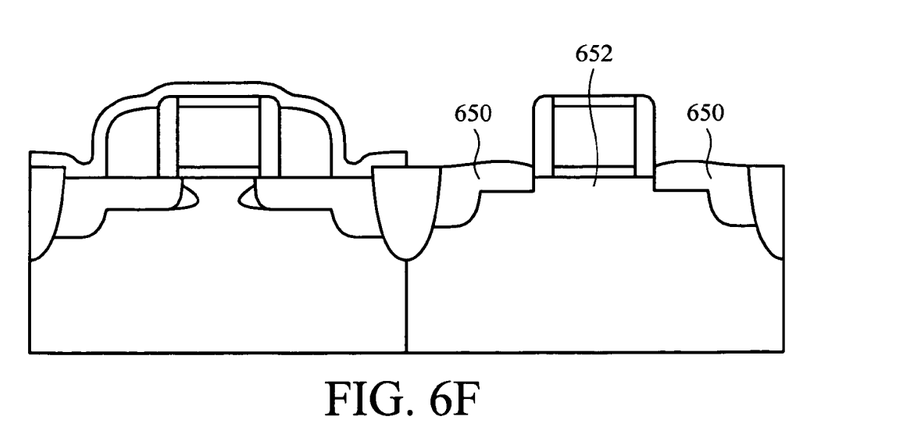

FIG. 6F shows the CMOS cell with stressed material 650 deposited in the first and second recesses. The stressed material 650 has residual stress that induces strain in the channel region 652, which in turn increases carrier mobility and improves the operating speed of the MOS transistor.

In a particular embodiment, the stressed material 650 is boron-doped SiGe that is epitaxially grown in the recesses on the underlying silicon by a selective epitaxial growth ("SEG") process to fill in the recesses, or alternatively to overfill the recesses (i.e., to a height higher than the original surface of the silicon wafer). Stressed material that is doped can provide doping species for the underlying and adjacent silicon. In other words, the boron-doped SiGe acts as a p-type dopant source. Other stressed materials and dopants are used in alternative embodiments, such as SiC, GaAs, GaN, which are semiconductors with different lattice constant from Si and can induce strain into channel.

Figure 6G:
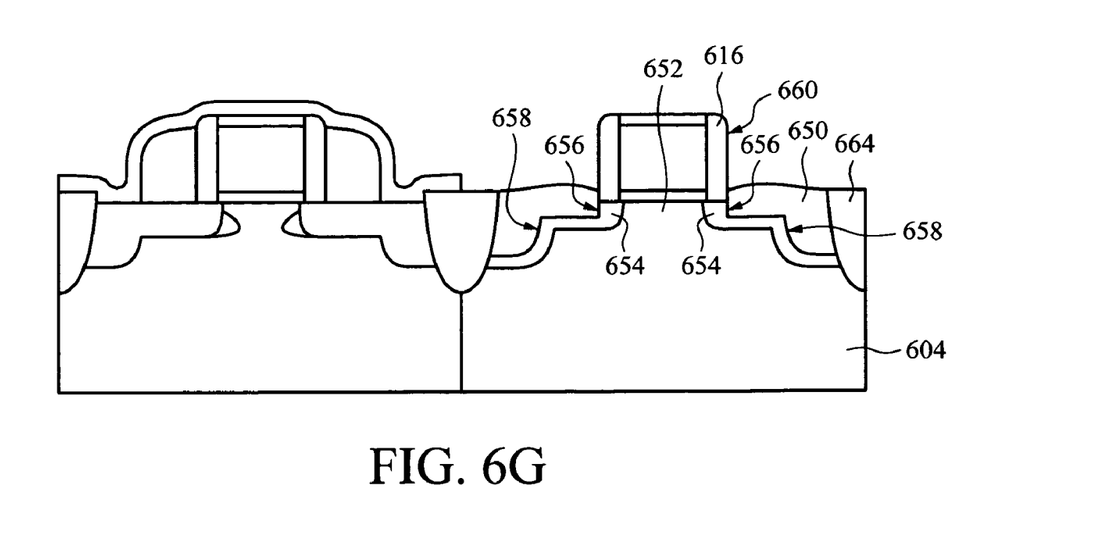

FIG. 6G shows the CMOS cell after a RTP annealing step, which has driven boron into the silicon to form extension regions 654 and has activated the boron dopant. The CMOS cell is completed using conventional processing steps, such as stripping the cap layers forming silicide over the gates, and so forth.

The PMOS portion 604 has stressed material 650 on either side of the channel region 652. The stressed material 650 extends to a first edge 656 that is next to the extension region 654 and essentially even with the surface 658 of the first sidewall spacer 616. Alternatively, the first edge extends further toward the channel region 652 than the surface 658 of the first sidewall spacer 616, such as when an isotropic etch step has been performed after the second anisotropic silicon etch step.

The amount of strain in the source/drain regions depends upon several factors, which include: the amount of silicon between the stressed material, the depth of the first edge (relative to the gate oxide), the depth of the second edge, and the lengths (i.e., amount) of the stressed material in the upper region of the stressed material (defined by the first edge 656 and isolation structure 664) and lower region of the stressed material (defined by the second edge 660 and the isolation structure 664).

The length of silicon between the first edges is shorter than the length between the second edges. Thus, for a given stress, the strain in the portion of the channel region between the first edges 656 is greater than the strain in the portion of the channel region between the second edges 658. The total stress is controllable by selecting the depth of the first recess (see FIG. 6C, ref. num. 628). Increasing the depth of the first recess increases the total stress in the stressed material 650. Since the first edges 656 bring the stressed material very close to the channel area, and the depth of the first recess can be selected to produce high stress, very high strain can be induced in the channel region of the device. The depths of the first and second recesses are separately controllable to optimize the stress contributed by the respective portions of the stressed material.

Figure 7:
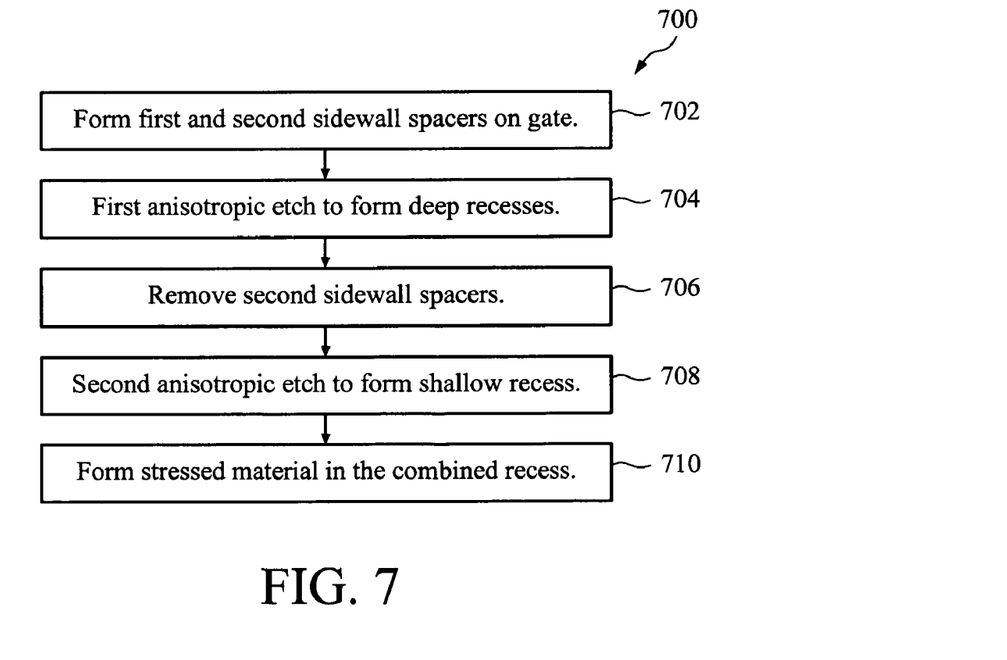
FIG. 7 is a flow chart of a method of fabricating an MOS transistor according to another embodiment of the invention.

FIG. 7 is a flow chart of a method 700 of fabricating an MOS transistor according to another embodiment of the invention. Many common steps familiar to those of skill in the art of MOS transistor fabrication are omitted for simplicity of discussion. First and second sidewall spacers are formed on the sides of a gate (step 702). In a particular embodiment, the first and second sidewall spacers are made of different materials to facilitate selectively etching the second sidewall spacers. The spacers have a combined thickness between about 25 nm and about 230 nm. A first anisotropic silicon etch is performed in the source and drain regions of the MOS transistor (step 704) to form a first recess. The first anisotropic silicon etch is self-aligned to the second sidewall spacers. In a particular embodiment, the first recess is etched to a depth of between about 50 nm and about 200 nm. The second sidewall spacers are removed (step 706), and a second anisotropic silicon etch is performed in the source and drain regions of the MOS transistor (step 708). The second anisotropic silicon etch is self-aligned to the first sidewall spacers. In a particular embodiment, the second recess is etched to a depth of between about 5 nm and about 50 nm from the original silicon surface. The first and second recesses form a combined recess having a depth between about 70 nm and about 200 nm. An isotropic etch is optionally performed if undercutting is desired.

Stressed material is formed in the combined recess (step 710). The stressed material optionally acts as a dopant source for the underlying silicon. In a particular embodiment, the MOS transistor is a PMOS transistor and boron-doped SiGe is epitaxially grown in the combined recess using an in-situ doping technique to create compressively stressed material that induces compressive strain in a channel region of the PMOS transistor. In an alternative embodiment, the MOS transistor is an NMOS transistor and SiC is grown in the combined recess.

If the stressed material is doped, a thermal treatment, such as an RTP, is typically performed to drive the dopant into the silicon and to activate the dopant. Conventional processing steps are performed to complete the fabrication of the MOS transistor. Using a two-step etch in combination with using doped stress material provides independent control of depth and profile of drain/source extensions and the source and drain. Similarly, using doped stressed material in a combined recess provides an ultra-shallow drain/source extension (compared to a conventionally implanted drain/source extension. Additionally, using stressed material, such as boron-doped SiGe, in a combined recess provides high stress in the channel and lower series resistance.

While the present invention has been described in connection with specific embodiments, variations of these embodiments will be obvious to those of ordinary skill in the art. For example, photo-masks other than the N-well masks are used in alternative embodiments so that the stressed material does not extend all the way to the isolation structure. Therefore, the spirit and scope of the appended claims should not be limited to the foregoing description.

The invention claimed is:

1. A metal-oxide-semiconductor ("MOS") transistor comprising:
   a channel region;
   a source region;
   a drain region;

stressed material in at least one of the source region and the drain region having a first edge and a second edge along one end of the stressed material, the first edge being between the second edge and the channel region so as to induce strain in the channel region sufficient to increase carrier mobility in the channel region; and a source/drain extension region between the first edge and the channel region.

2. The MOS transistor of claim 1 wherein the stressed material comprises epitaxially grown material.

3. The MOS transistor of claim 1 wherein the stressed material comprises selective epitaxial growth SiGe.

4. The MOS transistor of claim 1 wherein the stressed material is disposed on semiconductor material, the stressed material including a dopant so as to provide a dopant source for the semiconductor material.

5. The MOS transistor of claim 1 wherein the stressed material comprises boron-doped SiGe.

6. The MOS transistor of claim 1 wherein the MOS transistor is a first MOS transistor in a complementary MOS ("CMOS") cell.

7. The MOS transistor of claim 1 further comprising an isolation structure, wherein the first edge extends a first distance between the isolation structure and the channel region so as to provide a first selected stress producing a first strain in the channel region and the second edge extends a second selected distance between the isolation structure and the channel region so as to provide a second selected stress producing a second strain in the channel region.

8. The MOS transistor of claim 1 further comprising a source/drain extension region, wherein the first edge is next to the source/drain extension region and the second edge is next to the source/drain extension region.

9. The MOS transistor of claim 1 wherein the MOS transistor is a first MOS transistor in a complementary MOS ("CMOS") cell.

10. A metal-oxide-semiconductor ("MOS") transistor comprising:
a channel region;
a source region;
a drain region;
stressed material in at least one of the source region and the drain region having a first edge and a second edge along one end of the stressed material, the first edge being between the second edge and the channel region so as to induce strain in the channel region sufficient to increase carrier mobility in the channel region; and
an isolation structure, wherein the first edge extends a first distance between the isolation structure and the channel region so as to provide a first selected stress producing a first strain in the channel region and the second edge extends a second selected distance between the isolation structure and the channel region so as to provide a second selected stress producing a second strain in the channel region.

11. The MOS transistor of claim 10 wherein the stressed material comprises at least one material selected from the group consisting of epitaxially grown material, selective epitaxial growth SiGe, and boron-doped SiGe.

12. The MOS transistor of claim 10 wherein the stressed material is disposed on semiconductor material, the stressed material including a dopant so as to provide a dopant source for the semiconductor material.

13. The MOS transistor of claim 10 wherein the MOS transistor is a first MOS transistor in a complementary MOS ("CMOS") cell.

14. The MOS transistor of claim 10 further comprising a source/drain extension region, wherein the first edge is next to the source/drain extension region and the second edge is next to the source/drain extension region.

15. A metal-oxide-semiconductor ("MOS") transistor comprising:
a channel region;
a source region;
a drain region;
stressed material in at least one of the source region and the drain region having a first edge and a second edge along one end of the stressed material, the first edge being between the second edge and the channel region so as to induce strain in the channel region sufficient to increase carrier mobility in the channel region; and
a source/drain extension region, wherein the first edge is next to the source/drain extension region and the second edge is next to the source/drain extension region.

16. The MOS transistor of claim 15 wherein the stressed material comprises at least one material selected from the group consisting of epitaxially grown material, selective epitaxial growth SiGe, and boron-doped SiGe.

17. The MOS transistor of claim 15 wherein the stressed material is disposed on semiconductor material, the stressed material including a dopant so as to provide a dopant source for the semiconductor material.

* * * * *